(12) United States Patent
Fairbairn et al.

(10) Patent No.: US 6,625,497 B2
(45) Date of Patent: Sep. 23, 2003

(54) SEMICONDUCTOR PROCESSING MODULE WITH INTEGRATED FEEDBACK/FEED FORWARD METROLOGY

(75) Inventors: Kevin P. Fairbairn, Los Gatos, CA (US); Bo Su, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/901,462

(22) Filed: Jul. 10, 2001

(65) Prior Publication Data

US 2002/0155629 A1 Oct. 24, 2002

Related U.S. Application Data

(63) Continuation-in-part of application No. 09/714,984, filed on Nov. 20, 2000.

(51) Int. Cl.[7] .............................................. G05B 15/00
(52) U.S. Cl. .......................................................... 700/1
(58) Field of Search ........................... 438/14; 250/307, 250/559.4; 700/29; 33/520

(56) References Cited

U.S. PATENT DOCUMENTS 4,447,731 A    5/1984  Kuni et al.

(List continued on next page.)

FOREIGN PATENT DOCUMENTS

| EP | 0 727 715 | 8/1996 |
| JP | 61 290312 | 12/1986 |

OTHER PUBLICATIONS

European Search Report dated Mar. 30, 2001.*

(List continued on next page.)

*Primary Examiner*—John F. Niebling
*Assistant Examiner*—Andre C Stevenson
(74) *Attorney, Agent, or Firm*—McDermott, Will, and Emery; Joseph Bach

(57) ABSTRACT

A method and apparatus for processing a semiconductor wafer to reduce CD variation feeds back information gathered during inspection of the wafer to a previously visited processing tool and feeds forward information to adjust the next process the wafer will undergo. The inspection and processing are performed at a single processing module without exposing the wafer to ambient atmospheric conditions. Embodiments include removing a wafer from a wafer cassette, and measuring a dimension of a feature on the surface of the wafer, such as the feature's CD using an optical measuring tool. A process, such as an etch process, is then performed on the wafer using a set of process parameter values, such as an etch recipe, selected based on the CD measurement, and the wafer is returned to a cassette. The CD measurements are also linked to photolithography adjustable parameters such as stepper focus and exposure settings. The linked information on focus and exposure is fed back to the previously visited photo cell so the stepper can be adjusted, either automatically or at the user's discretion, to correct the deviation in following lots. In some embodiments, post-etch processing, such as ash stripping, wet cleaning and/or further CD measurement, are performed by the module before the wafer is returned to a cassette. All of the transfer and processing steps performed by the module are performed in a clean environment, thereby increasing yield by avoiding exposing the wafer to the atmosphere and possible contamination between steps. This feedback and feed-forward mechanism improves CD control by adjusting processing parameters for every wafer based on the wafer's measured CD.

10 Claims, 14 Drawing Sheets

U.S. PATENT DOCUMENTS

| | | | |
|---|---|---|---|
| 4,911,103 A | | 3/1990 | Davis et al. |
| 5,109,430 A | | 4/1992 | Nishihara et al. |
| 5,171,393 A | | 12/1992 | Moffat |
| 5,452,521 A | * | 9/1995 | Niewmierzycki ............ 33/520 |
| 5,653,894 A | | 8/1997 | Ibbotson et al. |
| 5,913,102 A | | 6/1999 | Yang |
| 5,926,690 A | | 7/1999 | Toprac et al. |
| 5,944,940 A | | 8/1999 | Toshima |
| 5,963,329 A | | 10/1999 | Conrad et al. |
| 5,980,766 A | | 11/1999 | Flamm et al. |
| 6,004,706 A | | 12/1999 | Ausschnitt et al. |
| 6,007,675 A | | 12/1999 | Toshima |
| 6,027,842 A | | 2/2000 | Ausschnitt et al. |
| 6,033,814 A | | 3/2000 | Burdorf et al. |
| 6,054,710 A | | 4/2000 | Bruggeman |
| 6,143,081 A | | 11/2000 | Shinriki et al. |
| 6,148,239 A | | 11/2000 | Funk et al. |
| 6,178,239 B1 | * | 11/2000 | Funk ............................. 700/1 |
| 6,225,639 B1 | * | 5/2001 | Adams ................... 250/559.4 |
| 6,245,581 B1 | | 6/2001 | Bonser et al. |

OTHER PUBLICATIONS

Ausschnit, Christopher P., et al., "Seeing the Forest for the Trees: A New Approach to CD Control," Ed. Bhanwar Singh, Proceedings of the SPIE, vol.3332, pp. 212–220, Feb. 23–25, 1998.

Moharam, M.G., et al., "Stable Implementation of the Rigorous Coupled–Wave Analysis for Surface–Relief Gratings: Enhanced Transmittance Matrix Approach," Journal of the Optical Society of America, vol. 12, No. 5, pp. 1077–1086, May 1995.

Chateau, Nicolas, "Algorithm for the Rigorous Coupled–Wave Analysis of Grating Diffraction," Journal of the Optical Society of America, vol. 11, No. 4, pp. 1321–1331, April 1994.

Davidson et al., "An Inverse Scattering Approach to SEM Line Width Measurements", Technical Program and Abstract Digest, SPIE's 24th International Symposium on Micorlithography, Mar. 1999, Santa Clara, CA.

Anthony J. Toprac, "AMD's Advanced Process Control of Poly–gate Critical Dimension", SPIE Conference on Process, Equipment and Materials Control in Integrated Circuit Manufacturing, Sep. 1999, Santa Clara, CA, SPIE vol. 3882.

Raymond, Christopher J., "Angle–Resolved Scatterometry for Semiconductor Manufacturing", *Microlithography World*, Winter 2000, pp. 18–23.

Lee, M.E., et al., "Analysis of Reflectometry and Ellipsometry Data from Patterned Structures", *Characterization and Metrology of ULSI Technology: 1998 International Conference*, ed. D.G. Seiler, et al., 1998, pp. 331–335.

McIntosh, J.M., et al., "Approach to CD SEM Metrology Utilizing the Full Waveform Signal" Proceedings of the SPIE, vol. 3332, pp. 51–60, Feb. 23, 1998.

* cited by examiner

|   A   |   B   |   C   |   D   |   E   |
|-------|-------|-------|-------|-------|
| $\Delta f_4 \Delta E_0$ | $\Delta f_4 \Delta E_1$ | $\Delta f_4 \Delta E_2$ | $\Delta f_4 \Delta E_3$ | $\Delta f_4 \Delta E_4$ |
| $\Delta f_3 \Delta E_0$ | $\Delta f_3 \Delta E_1$ | $\Delta f_3 \Delta E_2$ | $\Delta f_3 \Delta E_3$ | $\Delta f_3 \Delta E_4$ |
| $\Delta f_2 \Delta E_0$ | $\Delta f_2 \Delta E_1$ | ✕ | $\Delta f_2 \Delta E_3$ | $\Delta f_2 \Delta E_4$ |
| $\Delta f_1 \Delta E_0$ | $\Delta f_1 \Delta E_1$ | $\Delta f_1 \Delta E_2$ | $\Delta f_1 \Delta E_3$ | $\Delta f_1 \Delta E_4$ |
| $\Delta f_0 \Delta E_0$ | $\Delta f_0 \Delta E_1$ | $\Delta f_0 \Delta E_2$ | $\Delta f_0 \Delta E_3$ | $\Delta f_0 \Delta E_4$ |
|   A   |   B   |   C   |   D   |   E   |

FIG. 2A

SEMICONDUCTOR PROCESSING MODULE WITH INTEGRATED FEEDBACK/FEED FORWARD METROLOGY

RELATED APPLICATIONS

This application is a continuation-in-part of U.S. patent application Ser. No. 09/714,984, filed Nov. 20, 2000, entitled: INTEGRATED CRITICAL DIMENSION CONTROL FOR SEMICONDUCTOR DEVICE MANUFACTURING.

FIELD OF THE INVENTION

The present invention relates to a method and apparatus for monitoring and controlling processing carried out on a semiconductor substrate, and more particularly for controlling critical dimensions (CDs) of features formed on the semiconductor substrate through feedback and feed-forward of information gathered during in-process inspection of the features. The invention has particular applicability for in-line inspection of semiconductor wafers during manufacture of high-density semiconductor devices with submicron design features.

BACKGROUND ART

Current demands for high density and performance associated with ultra large scale integration require submicron features, increased transistor and circuit speeds and improved reliability. Such demands require formation of device features with high precision and uniformity, which in turn necessitates careful process monitoring, including frequent and detailed inspections of the devices while they are still in the form of semiconductor wafers.

One important process requiring careful inspection is photolithography, wherein masks are used to transfer circuitry patterns to semiconductor wafers. Typically, a series of such masks are employed in a preset sequence. Each photolithographic mask includes an intricate set of geometric patterns corresponding to the circuit components to be integrated onto the wafer. Each mask in the series is used to transfer its corresponding pattern onto a photosensitive layer (i.e., a photoresist layer) which has been previously coated on a layer, such as a polysilicon or metal layer, formed on the silicon wafer. The transfer of the mask pattern onto the photoresist layer is conventionally performed by an optical exposure tool such as a scanner or a stepper, which directs light or other radiation through the mask to expose the photoresist. The photoresist is thereafter developed to form a photoresist mask, and the underlying polysilicon or metal layer is selectively etched in accordance with the mask to form features such as lines or gates.

Fabrication of the mask follows a set of predetermined design rules set by processing and design limitations. These design rules define the space tolerance between devices and interconnecting lines and the width of the lines themselves, to ensure that the devices or lines do not overlap or interact with one another in undesirable ways. The design rule limitation is referred to as the critical dimension ("CD"), defined as the smallest width of a line or the smallest space between two lines permitted in the fabrication of the device. The CD for most ultra large scale integration applications is on the order of a fraction of a micron.

As design rules shrink and process windows (i.e., the margins for error in processing) become smaller, inspection and measurement of surface features° CD, as well as their cross-sectional shape ("profile") are becoming increasingly important. Deviations of a feature's CD and profile from design dimensions may adversely affect the performance of the finished semiconductor device. Furthermore, the measurement of a feature's CD and profile may indicate processing problems, such as stepper defocusing or photoresist loss due to over-exposure.

Thus, CD and profile values, and the variation of feature CD from design dimensions, are important indicators of the accuracy and stability of the photoresist and etch processes, and "CD control" to reduce such variation is an important part of semiconductor processing. CD control necessarily involves monitoring and adjusting both the photolithography and etch processes to address CD variations from field to field (FTF) within a wafer, from wafer to wafer (WTW) and from lot to lot (LTL). Among FTF, WTW and LTL variation, FTF and LTL are dominant variation components, while WTW typically counts for less than 10% of the total CD variation. FTF variation is generally determined by process tool performance, such as photoresist coating and baking uniformity, stepper or scanner stage leveling, and etch micro-loading uniformity. On the other hand, LTL variation is generally determined by process stability, including process equipment stability.

Because of the extremely small scale of current CD's, the instrument of choice for measurement and inspection of surface features produced by photolithographic processing is a scanning electron microscope (SEM) known as a "critical dimension scanning electron microscope" (CD-SEM). Although conventional SEM's are useful for measuring CD's, they generally do not provide immediate feedback to the photolithography process to reduce LTL variations. SEM measurement is performed "off-line" because it is relatively slow and typically needs to be performed at a separate review station. Consequently, the results of conventional SEM inspections are not typically used to adjust subsequent etch processing; that is, the CD measurement of a particular wafer is not used to decide what etch recipe should be used to process that wafer. Thus, the information gathered from the CD-SEM measurement is not utilized to the fullest extent that will help to improve yield. As a further consequence of the inspection necessarily taking place at a physically separate tool, the wafers must be transferred to and from the tool for every inspection performed. This exposes the wafers to the ambient atmosphere, which can result in unwanted oxidation of the wafer surface or deposition of foreign particles on the surface, thereby lowering yield.

A related process where CD is crucial is known as "resist trim". As those skilled in the art will appreciate, photolithography employing light to expose sub-micron features on a photoresist layer is very costly and complicated. Thus, techniques have been developed to use photolithograpy equipment to expose features that are larger than desired, then follow this exposure with a process called a resist trim to "shrink" the exposed features to their final size. Specifically, after the oversized features are exposed and the photoresist developed, the wafer is brought to an etch chamber, and a specifically designed "resist etch step" is carried out, typically an isotropic etch step that shrinks the size of the developed resist feature. The actual feature (e.g., a polysilicon gate or metal line) is thereafter etched, typically using a different etch recipe in the same or in a different etch chamber.

One method for monitoring and correcting CD variations related to the resist trim process is disclosed in U.S. Pat. No. 5,926,690 to Toprac et al. Toprac teaches selecting one or more test wafers from a lot of wafers whose photoresist has been exposed and developed to create larger-than-desired features, and measuring a representative photoresist feature CD from the test wafers, as with a CD-SEM. The wafers are then processed through a photoresist etch step and a gate etch step, and the CD of the etched feature is measured. The results of the initial and final CD measurements are then used to adjust the etch recipe for the remaining wafers in the lot to drive their CDs to target values. Like other conventional CD monitoring techniques, Toprac teaches measuring CDs of sample wafers (i.e., initially measuring photoresist features formed on the wafers and then measuring gates) off-line at a SEM, and the CD of a particular feature on a wafer is not used to decide what etch recipe is used for processing that wafer.

There exists a need for a simple, cost-effective methodology for fast and meaningful identification and correction of CD variation without significantly reducing production throughput or yield. There also exists a need for a robust and efficient apparatus and methodology for accurately carrying out resist trim operations.

SUMMARY OF THE INVENTION

An advantage of the present invention is the ability to reduce CD variations in semiconductor wafers without reducing production throughput or yield, by utilizing information gathered during in-process inspection of the wafers.

According to the present invention, the foregoing and other advantages are achieved in part by an apparatus for processing a semiconductor wafer comprising a measuring tool for imaging the wafer to obtain a data set representative of a CD of a target feature on the wafer; a storage medium that stores a plurality of reference data sets, each reference data set representative of a reference feature CD and associated with a different known set of first process parameter values; a processor configured to identify the reference data set that most closely matches the target feature data set to obtain the first process parameter values for performing a first process on the wafer; a first processing tool for performing the first process on the wafer using the first set of process parameter values; a transfer mechanism for transferring the wafer between the measuring tool and the first processing tool; and a chamber for enclosing the transfer mechanism and allowing communication between the transfer mechanism, the measuring tool and the first processing tool in a clean and controlled environment.

Another aspect of the present invention is that the processor is further configured to select a second set of process parameter values based on the imaging of the target feature CD, and provide the second set of process parameter values to a previously visited processing tool.

Additional advantages of the present invention will become readily apparent to those skilled in this art from the following detailed description, wherein only exemplary embodiments of the present invention are shown and described, simply by way of illustration of various modes contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout, and wherein:

FIGS. 2A and 2B are conceptual illustrations of the reference library used in practicing an embodiment of the present invention.

DESCRIPTION OF THE INVENTION

Figure 1:
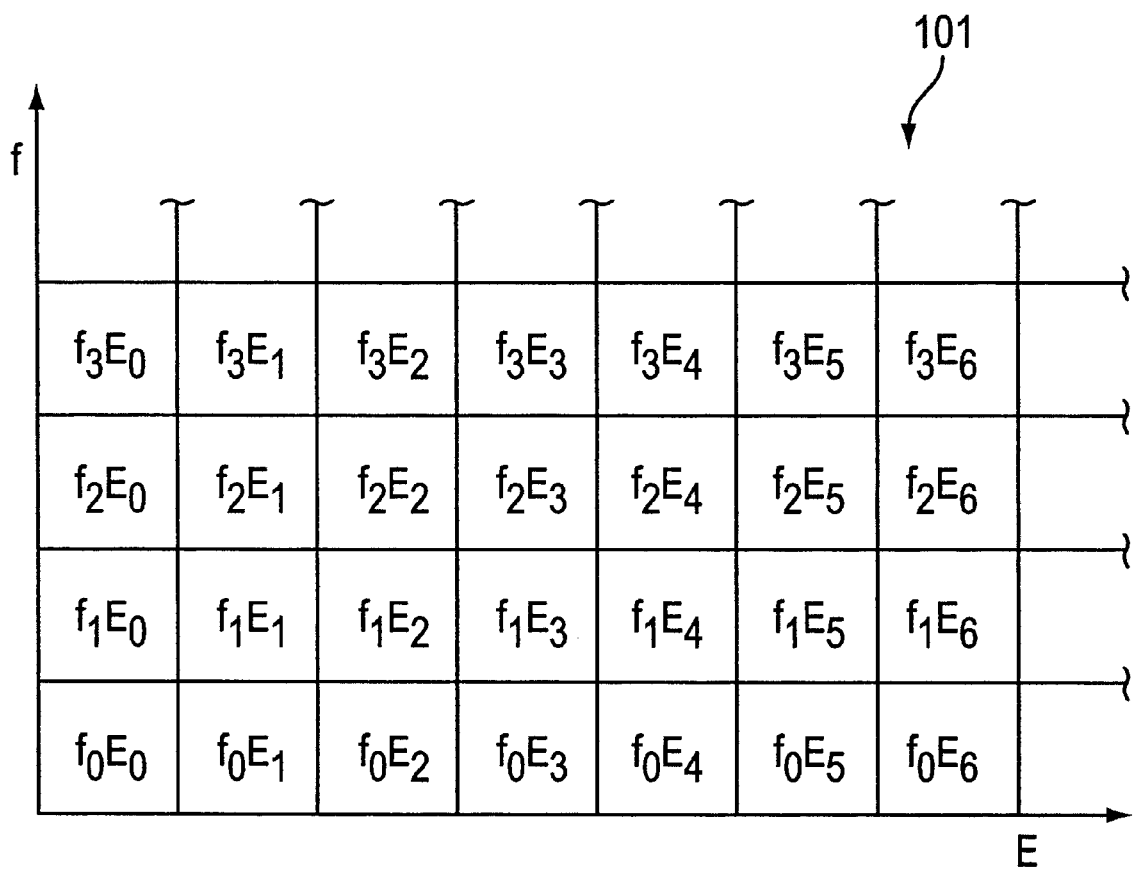
FIG. 1 illustrates a portion of a focus exposure matrix used in practicing an embodiment of the present invention.

Conventional methodologies for in-process inspection of features formed on the surface of semiconductor wafers are not capable of analyzing CD and/or profile deviations from design rules in sufficient detail to provide information leading to early positive identification of the source of the defect or enabling process control to reduce dimensional variation. The present invention addresses the problem of CD control by reducing the CD variation by feeding back information gathered during inspection of a wafer (e.g., after photoresist development) to upcoming lots that will be going through the photolithography process, and by feeding forward information to adjust the next process the inspected wafer will undergo (e.g., the etch process). In certain embodiments of the present invention, the CD measurement, etch processing and post-etch cleaning are performed at a single module in a controlled environment, thereby increasing throughput and improving yield.

According to the methodology of the present invention, after a feature such as an integrated circuit pattern is formed on a lot or batch of semiconductor wafers at a "photo cell" by a photolithography process (e.g., exposure at a stepper followed by photoresist development), one or more wafers of the lot are chosen for inspection and the feature is imaged, typically at several sites on each wafer to be inspected, as with a CD-SEM or optical inspection tool, to measure its CD and other sensitive parameters such as edge width and profile grade, and to obtain an inspection waveform. The measured parameters are linked to photolithography adjustable parameters such as stepper focus and exposure settings. Thus, if the measured parameters deviate from design dimensions, the linked information on focus and exposure can be fed back to the photo cell so the stepper can be adjusted, either automatically or at the user's discretion, to correct the deviation in following lots. Furthermore, the measured parameters are also linked to etch process adjustable parameters such as etch recipes for different over-etch and/or etch chemistry. Therefore, if the measured parameters deviate from desired values, a linked etch recipe to correct the error can be fed forward to the etcher, which recipe can be implemented automatically or at the user's discretion to process the wafers in the inspected lot. Thus, the feedback and feed-forward mechanism of the present invention improves lot to lot CD control at inspection following photoresist development and at final inspection.

The links between the measured feature parameters, the photolithography adjustable parameters and etch adjustable parameters is accomplished through "library building". Specifically, in one embodiment of the present invention, a "library" of reference waveforms, such as conventional SEM waveforms, is created by imaging a plurality of reference features formed, as on a test wafer in the photo cell, using the reticle which will be used in producing the features to be inspected. Each of the reference features is formed using different process parameters, such as different stepper focus and exposure settings. After creating the reference SEM waveforms, the profile of each of the reference features is imaged, if desired, as by a cross-section FIB-SEM. Thus, each reference SEM waveform is associated with known stepper settings and, optionally, a known profile. Additionally, an etch recipe that, when used with a reference feature, will result in a finished feature with a desired CD, is linked with each reference waveform. In other words, an etch recipe that will compensate for deviations in the reference feature is linked to each reference feature. Subsequently, the reference waveform associated with the particular cross-section SEM waveform having optimal CD, profile and/or other characteristics is chosen and identified as a "golden waveform".

A feature of unknown CD is conventionally imaged with an SEM, and the resulting waveform is compared to the golden waveform. If the feature's waveform does not substantially match the golden waveform, it is compared to the reference feature waveforms to find the closest matching reference waveform. The profile and stepper settings of the matching reference waveform (which correspond to the profile and stepper settings of the feature under inspection) can then be compared to those associated with the golden waveform and fed back to the photo cell for automatic or manual process adjustment. Furthermore, the etch recipe of the matching reference waveform can be fed forward to the etcher to adjust the CDs of the features of the wafers in the lot under inspection resulting from the etch process. Thus, stepper focus and exposure settings of sample features from a lot under inspection are pinpointed, and an optimal etch recipe for the lot determined, by obtaining each feature's SEM waveform and comparing the waveform to a library of reference feature waveforms, thereby enabling feedback to the photo cell and feed-forward to the etcher to adjust process parameters to reduce lot to lot CD variation.

In one embodiment of the invention, the library of reference waveforms is formed as a focus exposure matrix ("FEM") on a test wafer, which is a conventional technique for obtaining the best exposure/focus combination when new masks are produced or after a change in the fabrication recipe; i.e., to optimize the process by finding the combination of stepper focus and exposure which results in the best resolution on the wafer, in keeping with the required CD. The FEM procedure typically comprises sequentially exposing a series of areas of the test wafer with the pattern of the mask, while exposure and focus values are incrementally changed from one exposure location to the next. Specifically, the test wafer is exposed in a stepper while the focus is varied along one axis and the exposure is varied along the other. Thus, a matrix of features is obtained on the exposed wafer, wherein each exposure site or die has a different focus-exposure setting.

FIG. 1 illustrates a portion of a focus-exposure matrix. The matrix 101 is formed by patterning the wafer surface using light or other radiation passing through the mask. A single wafer may include tens or hundreds of dies depending on die size, each of which corresponds to one of the exposure areas, or "cells", shown in FIG. 1. For convenience, only a small number of the dies are illustrated. Each of the cells of the matrix has an incrementally different exposure E and/or was formed with an incrementally different focus f than any of the surrounding cells, as referenced by nomenclature $f_n E_m$ in the drawings. The focus is varied along one axis while the exposure is varied along the other axis in the formation of the matrix.

After exposure of the wafer, the individual exposure sites are developed and then examined with a conventional CD-SEM scan to measure the feature's CD, and the resulting inspection waveforms stored to obtain a reference waveform for each site. Alternatively, the inspection waveforms can be obtained with an optical inspection tool. An example of such a tool is described in U.S. Pat. No. 5,963,329 to Conrad. The optical inspection tool can also utilize scatterometry or reflectometry techniques. The use of scatterometry for inspection tools is disclosed in Raymond, "Angle-resolved scatterometry for semiconductor manufacturing", *Microlithography World,* Winter 2000. The use of reflectometry for inspection is taught in Lee, "Analysis of Reflectometry and Ellipsometry Data from Patterned Structures", *Characterization and Metrology for ULSI Technology:* 1998 *International Conference,* The American Institute of Physics 1998.

The exposure sites can be imaged, if desired, with an atomic force microscope (AFM) or sectioned and imaged with a cross-section FIB-SEM to determine their respective profiles. An evaluation of the CD, cross-sectional profile images, and other measured parameters is performed to determine the combination of focus and exposure settings which produces the best feature characteristics. The reference waveform (i.e., SEM waveform or optical waveform) corresponding to the combination of stepper focus and exposure settings that produced the best characteristics is then designated as a golden waveform. Each reference waveform is further associated with an etch recipe experimentally determined to be the optimal recipe to produce a finished feature (after etching) with a CD as close as possible to design dimensions, given the measured CD and other characteristics of the reference feature.

Figure 2B:
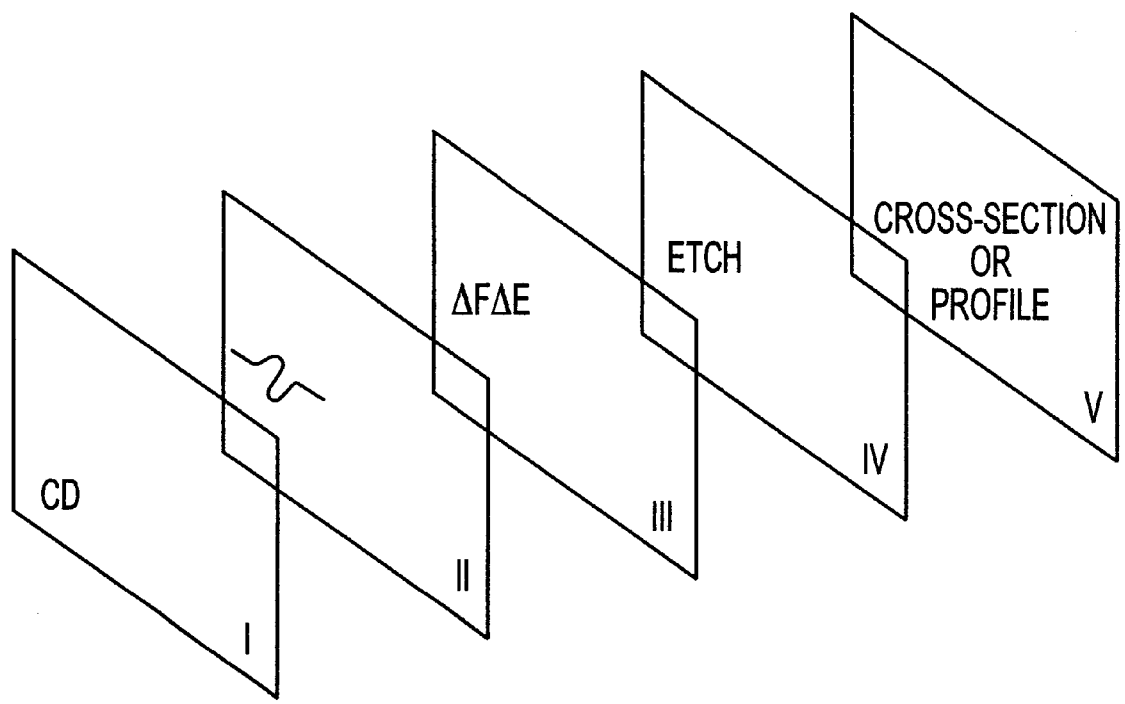

The concept of the reference library of the present invention is illustrated in FIGS. 2A and 2B. In FIG. 2A, which is based on the FEM of FIG. 1, the optimized process condition is represented by the cell marked "x". All other cells preferably cover a reasonable range of process variation, or the "process window", wherein $\Delta f_n$ and $\Delta E_m$ are each measured as the difference from cell x; that is, $\Delta f$ and $\Delta E$ are both zero in cell x, and $\Delta f$ and $\Delta E$ of the other cells are exposure doses and focus settings relative to the optimal exposure and focus. Each exposure column A–E represents a different etch recipe. Since the etch recipe adjustment applies to CD in this exemplary embodiment, the etch recipes' assignments are aligned with the exposure columns. FIG. 2B represents an expansion of each cell of FIG. 2A. A measured CD value (e.g., in box I) and an inspection waveform (e.g., in box II) are linked within a cell to $\Delta f_n \Delta E_m$ (e.g., in box III), to an etch recipe (e.g., in box IV) and to a cross section or image of the profile of the inspected feature (e.g., in box V).

Figure 3:
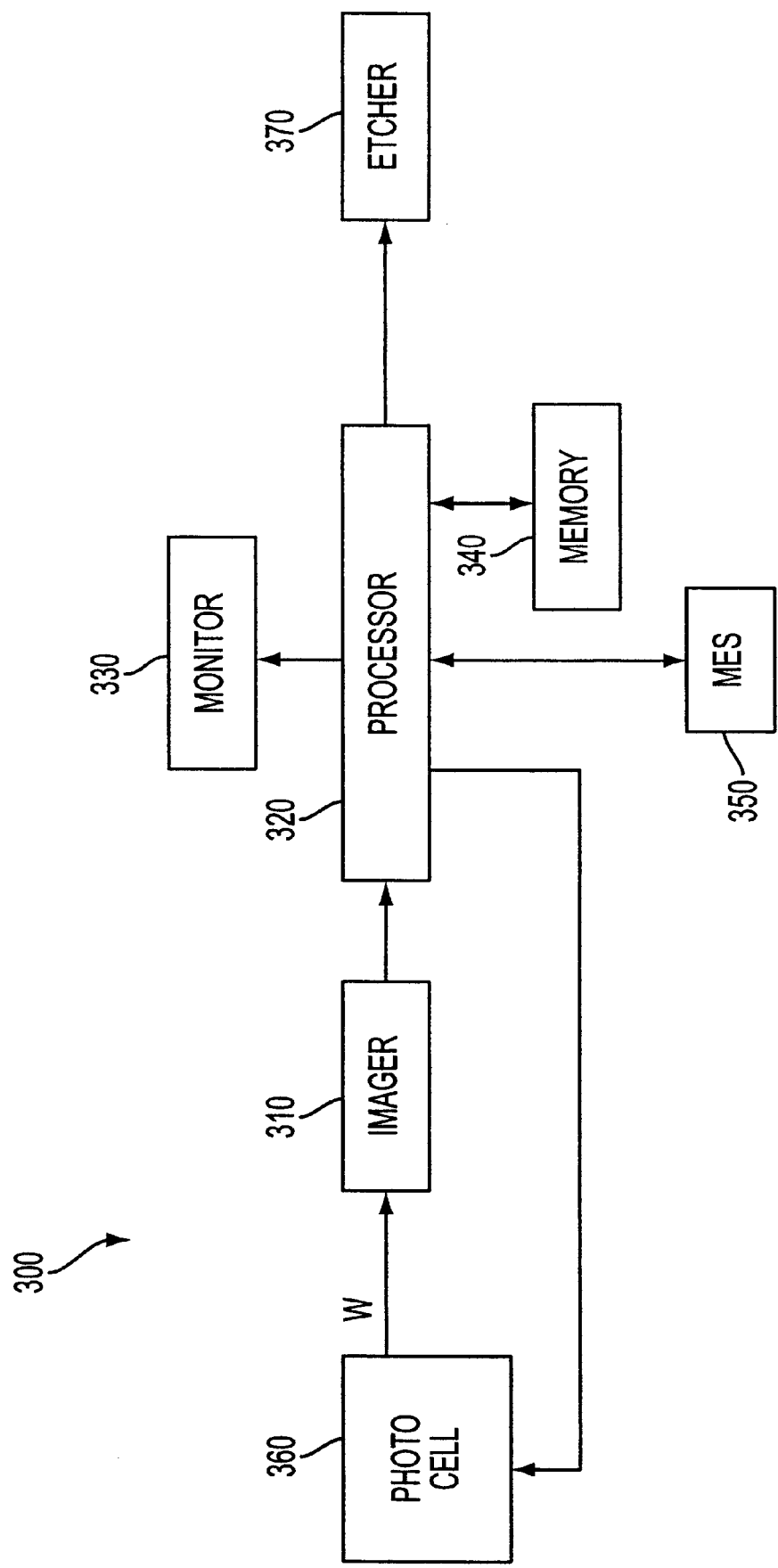
FIG. 3 is a block diagram of a review tool according to an embodiment of the present invention.

An exemplary embodiment of the present invention is implemented using a review tool in a processing line 300, as shown in FIG. 3, comprising an imager 310, e.g., a CD-SEM such as the VeraSEM™ available from Applied Materials of Santa Clara, Calif., or an optical imager as disclosed in U.S. Pat. No. 5,963,329. Processing line 300 further comprises a processor 320, which preferably performs the analysis disclosed herein electronically, and a monitor 330 for displaying results of the analyses of processor 320. Processor 320 can be in communication with a memory device 340, such as a semiconductor memory, and a computer software-implemented database system 350 known as a "manufacturing execution system" (MES) conventionally used for storage of process information. Processor 320 can also be in communication with previously-described photo cell 360 and etcher 370.

Figure 4A:
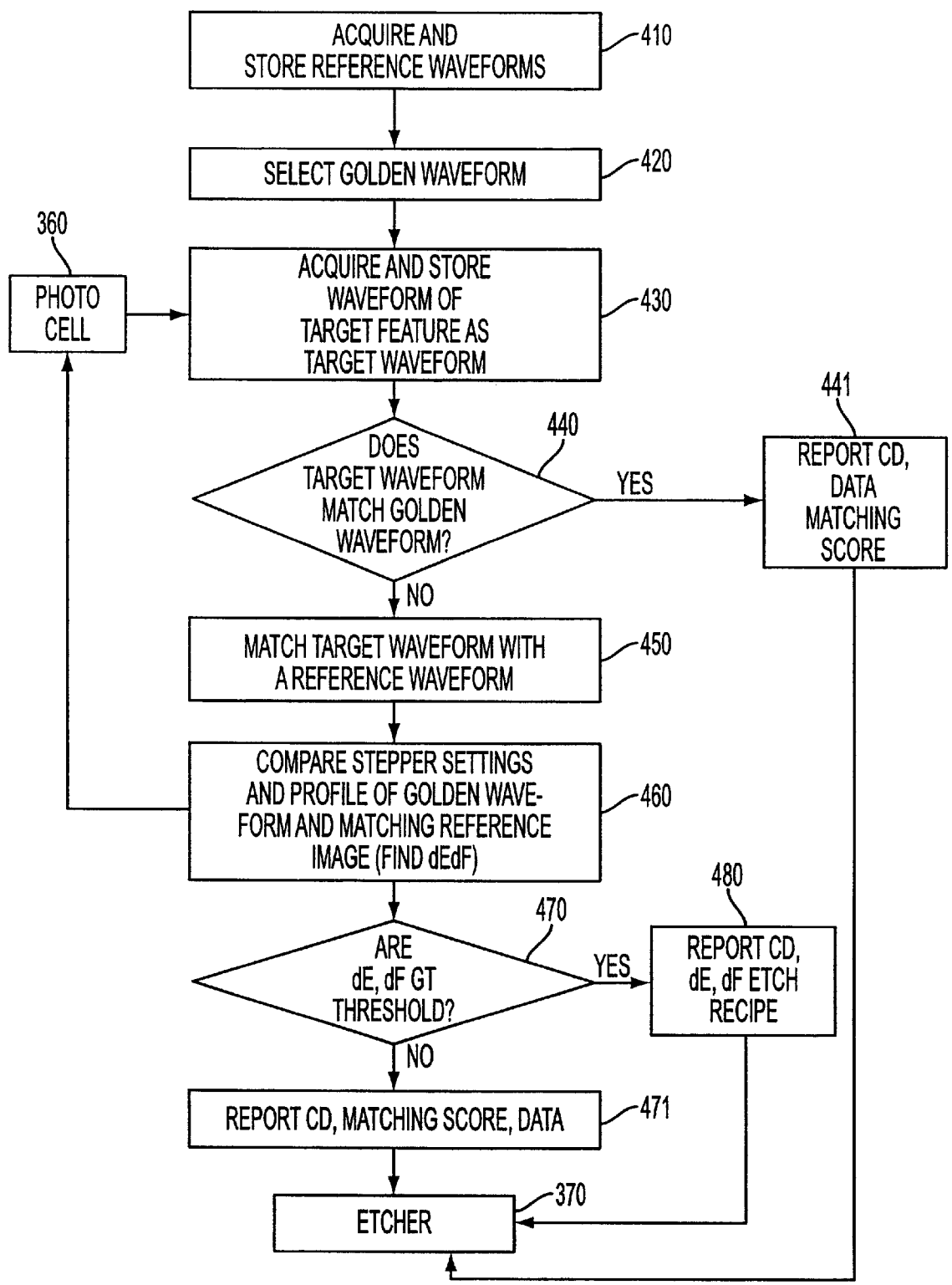
FIGS. 4A and 4B are flow charts illustrating sequential steps in methods according to embodiments of the present invention.

FIG. 4A is a flow chart illustrating the major steps of process control according to an embodiment of the present invention, implemented in conjunction with inspecting a feature (hereinafter called a "target feature") such as transistor gate formed on a semiconductor wafer W at photo cell 360. At step 410, the reference library is created, including reference CDs and waveforms in the form of SEM or optical waveforms, and stored locally in processor 320 or in MES 350. The stepper settings associated with each of the reference waveforms and the appropriate etch recipes are stored along with the waveforms. Profile images can also be stored, if desired by the user. The reference library is created only once for each layer to be inspected, such as when a series of process steps, such as photo cell 360, creates a "critical layer" that the user determines must be inspected. The golden waveform; i.e., the waveform associated with the reference feature exhibiting optimal CD and/or other characteristics, is selected at step 420.

Wafer W, having features with unknown CD and other characteristics, is brought to imager 310 from photo cell 360, the target feature is imaged by imager 310 at step 430, and its waveform is stored as a target waveform. At step 440, the target waveform is compared to the stored golden waveform. If the target waveform and golden waveform match within predetermined limits, the CD of the target feature is reported to the user, as by a display on monitor 330, along with a "matching score" indicating the amount of deviation of the target waveform from the golden waveform (see step 441). The results (i.e., the data) from the inspection are then sent to MES 350, and wafer W is sent to etcher 370 for further processing.

If the target waveform does not match the golden waveform, the target waveform is compared to each of the reference waveforms in the library to identify the reference waveform most closely matching the target waveform (see step 450). The reported stepper settings are compared with those associated with the golden waveform at step 460 to determine the difference dEdF between the settings which produced the golden waveform and those which produced the target waveform; e.g., determine the difference between the focus setting associated with the golden waveform and the focus setting associated with the target waveform, and determine the difference between the exposure setting associated with the golden waveform and the exposure setting associated with the target waveform. This information is then sent to photo cell 360, where it is used to correct the stepper settings to minimize "drift" in the stepper, which would cause CD variations in subsequently processed wafers, by indicating the amount of adjustment to the stepper that is required, as well as which particular adjustments (i.e., focus, exposure, or both) should be made.

Next, dE and dF are compared to predetermined threshold values at step 470. If dE and dF are not greater than the predetermined threshold values, the CD and matching score of the target feature are reported at step 471, the data from the inspection is then sent to MES 350, and wafer W is sent to etcher 370. On the other hand, if dE and dF are greater than the predetermined threshold values, the CD and matching score of the target feature is reported at step 480, along with dE and dF and the associated etch recipe, which is sent to etcher 370 to adjust (or "update") the etch recipe to correct the CD deviation of the finished features on wafer W. The etch recipes can typically adjust the CD within a range of about 10% or less.

The feedback and feed-forward of steps 460 and 480 can be done manually or automatically. In "manual mode", the user takes the reported process correction information and implements it manually at photo cell 360 and/or etcher 370. This allows expert input from the user to decide the need for process adjustment. In "automatic mode", the process correction information is automatically fed to the stepper in photo cell 360 or to etcher 370 to effect the correction through recipe updating. This mode can be implemented by a software interface allowing communication between processor 320 and etcher 370, and between processor 320 and photo cell 360. The predetermined threshold test of step 470 can be used as a sensitivity filter to determine if updating is necessary. The automatic mode is advantageous because it enables quick feedback and consistency.

The above embodiment of the present invention has been described relative to a "golden waveform" technique. However, it should be realized that any CD measurement technique capable of correlating metrology such as CD measurement to an etch recipe and to feature profile and/or cross-section can be used to implement the present invention. An example of such a technique is discussed in "An Inverse Scattering Approach to SEM Line Width Measurements", Mark P. Davidson and Andras E. Vladar, Proceedings of SPIE, Vol 3677 (1999), the entire disclosure of which is hereby incorporated by reference. In this particular technique, SEM waveforms are matched to a library of Monte Carlo simulations to predict the sidewall shape and dimensions of a feature (i.e., the feature profile).

Typically, the exemplary methodology is carried out after a lot of wafers, such as about 25 wafers, is processed by photo cell 360. A number of wafers W from the lot are selected to be inspected, according to the user's preference. For example, when manufacturing microprocessors, 1–3 wafers are typically selected for inspection; however, when manufacturing memory devices such as DRAMs, only one wafer is typically inspected per lot. A number of sites on each selected wafer W are usually inspected by the present methodology (i.e., to be target features at step 430), such as about 9–17 sites per wafer W.

To determine the etch recipe to be implemented at step 480 when a number of target features from one or more wafers W in a lot are inspected, the CDs of all the target features of the lot can be averaged, and the etch recipe associated with the average CD used to adjust the etch processing of the lot. To determine the stepper focus and exposure information (dEdF) fed back to photo cell 360 at step 460 to adjust the photolithographic processing of following lots when a number of target features in a lot are inspected, the user can employ previously gathered process information to decide which sites on selected wafers W to inspect, and then decide which inspected feature's information to use to adjust photo cell 360.

Figure 4B:
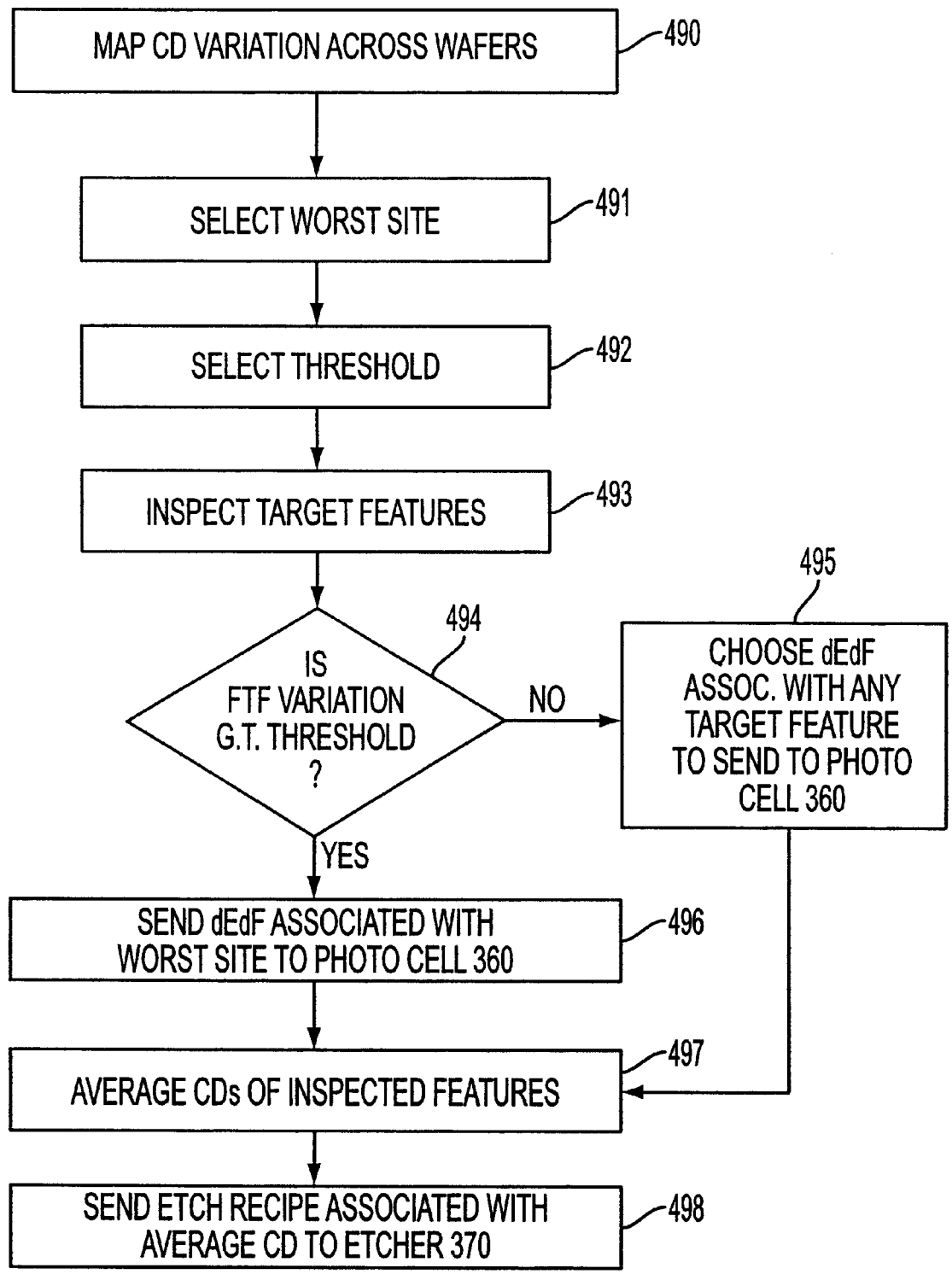

This is illustrated in FIG. 4B, which is a flow chart of an embodiment of the invention. At step 490, the user maps field to field CD variations across a number of wafers prior to inspection using the present methodology. This is a standard process control technique practiced by virtually all wafer fabricators. It indicates which areas of the wafer typically have small CD variations from the design value, and which areas of the wafer typically have a large CD variation. For example, some wafer processing equipment (e.g., photo cell 360) produces wafers having a small CD variation in the center of the wafer and larger CD variations at the periphery. Other equipment produces wafers having large CD variations near the center of the wafer and small CD variations in a band surrounding the center. After mapping the CD variations, the user identifies, at step 491, an area or areas of the wafers that exhibit the worst CD variation.

Next, the user selects a threshold CD variation representing the smallest CD deviation the user wishes to correct (see step 492). Target features are then inspected at step 493 using the inventive methodology (e.g., steps 430 et seq. described above). Target features are selected such that fields in the worst part of the wafer, identified at step 491, are represented. If the field to field variation of the inspected features is smaller than the predetermined threshold (see step 494), dEdF associated with any one of the target features can be fed back to photo cell 360 for use in adjusting the processing of subsequent lots (step 495), since they are relatively close to each other. On the other hand, if the field to field variation of the inspected features is larger than the threshold value selected in step 492, dEdF associated with an inspected feature from the predetermined worst site from step 491 is fed back to photo cell 360 (see step 496). Thus, the worst CD variation is corrected in subsequent lots.

At step 497, the CDs of the inspected features are averaged, and at step 498, the etch recipe associated with the average CD is fed forward to etcher 370 to adjust (or "update") the etch recipe to correct the CD deviation of the features on the wafers in the inspected lot. Thus, this embodiment of the present invention allows the user to employ information, such as field to field CD variation maps, that they gather as a matter of course independently of implementing the present invention, to reduce lot to lot variation with minimal added cost and inspection time.

Figure 6A:
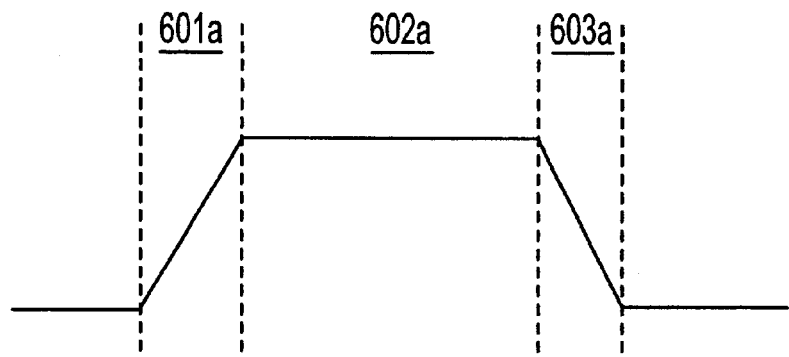
FIG. 6A is a view of a profile of a feature to be inspected using the methodology of the present invention.
Figure 6B:
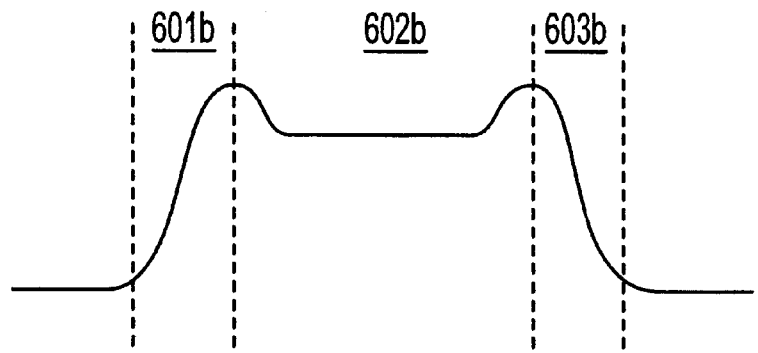
FIGS. 6B and 6C are graphical representations of waveforms used in practicing an embodiment of the present invention.
Figure 6C:
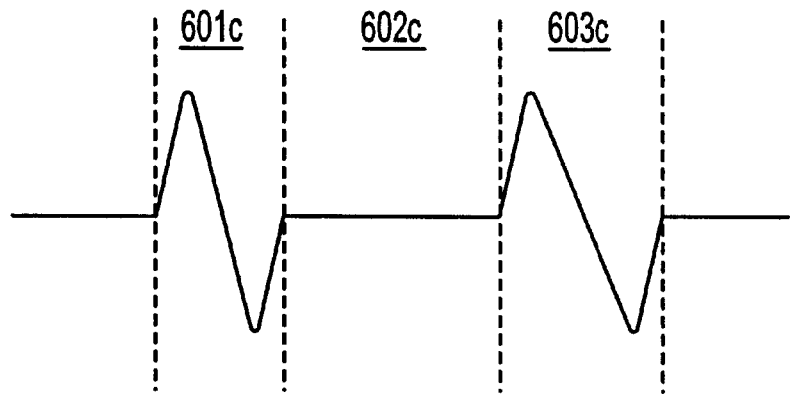

In another embodiment of the invention, the step of comparing the target waveform to the golden waveform (see FIG. 4A, step 440) and the step of matching the target waveform to one of the reference waveforms (step 450) comprise comparing only a selected portion of the target waveform and the reference/golden waveforms which represents a significant feature of the profile under inspection. By analyzing only a portion of the waveforms containing the most pertinent information, processing time is reduced. FIG. 6A depicts a typical feature profile, FIG. 6B shows the corresponding inspection waveform of the feature of FIG. 6A, and FIG. 6C is a graphical representation of the first derivative of the waveform of FIG. 6B. Since portions 601*a* and 603*a* are the most important areas of the feature profile to be inspected, and correspond to segments 601*b* and 603*b* of the waveform in FIG. 6B and segments 601*c* and 603*c* of the first derivative shown in FIG. 6C, it is advantageous to match segments 601*c* or 603*c* of the first derivatives of the target and reference waveforms.

Figure 6D:
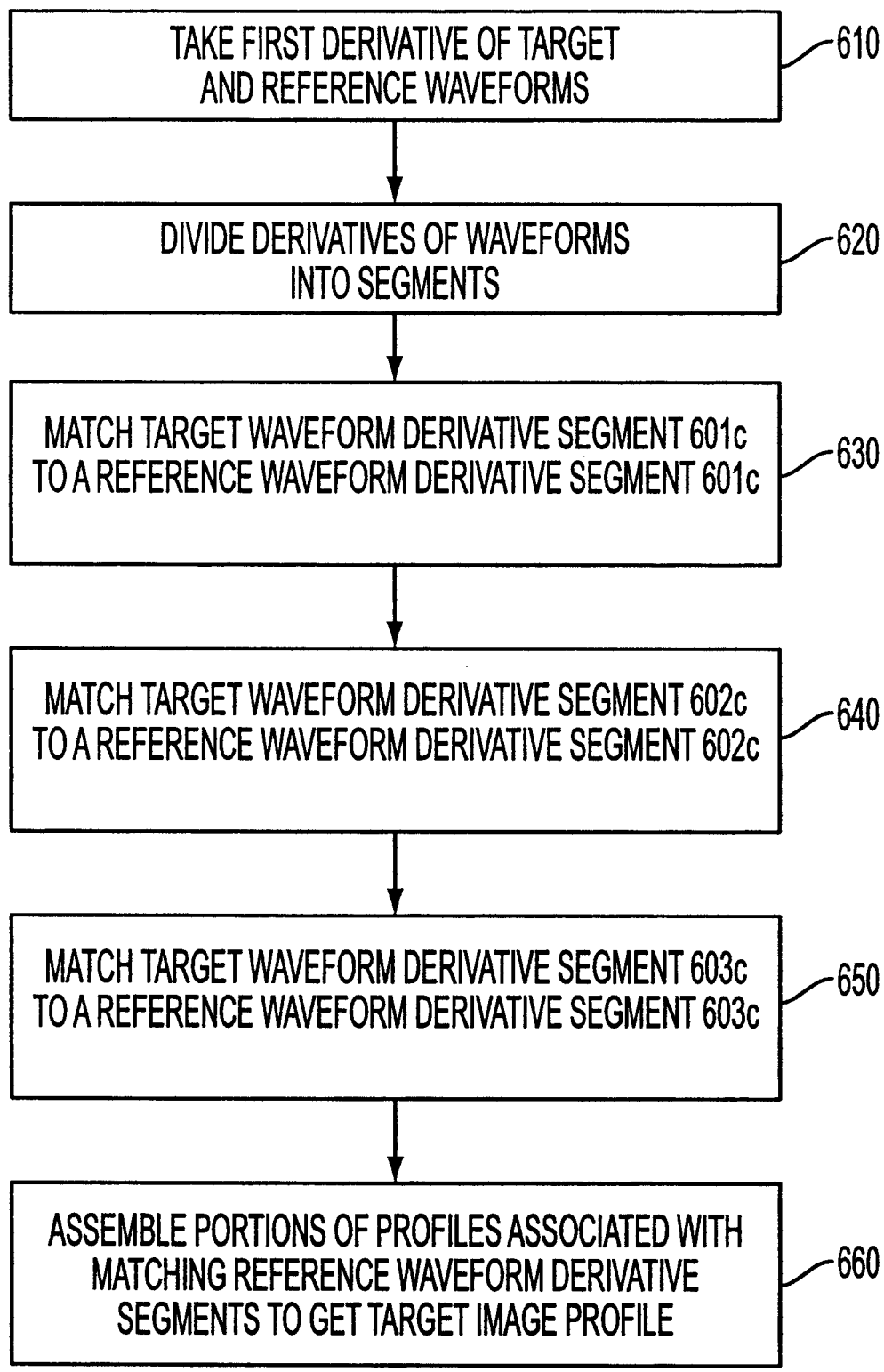
FIG. 6D is a flow chart illustrating sequential steps in a method according to an embodiment of the present invention.

In still another embodiment of the invention, as illustrated in the flow chart of FIG. 6D, if the target waveform does not match the golden waveform in step 440 of the flow chart of FIG. 4A, the first derivative of the target and reference waveforms are taken (step 610), and divided into segments at step 620, such as segments 601*c*, 602*c* and 603*c* in FIG. 6C. Then, each of segments 601*c*, 602*c* and 603*c* of the derivative of the target waveform is separately matched to a corresponding segment of the derivative of a reference waveform (see steps 630, 640, 650), which is associated with a portion of a known profile (e.g., portion 601*a*, 602*a*, 603*a* of FIG. 6A). Thus, the profile of the target feature is predicted by assembling "building blocks" of matching segments (step 660). An examination of the predicted profile will indicate what part or parts of the profile deviate from design standards, and such information can be used by one skilled in the art to trace photolithographic processing problems, such as focus and exposure problems.

In a further embodiment of the present invention, the step of comparing the target waveform to the golden waveform (step 440) and the step of matching the target waveform to one of the reference waveforms (step 450) comprise employing an algorithm to "fit a curve" to the target and reference waveforms such as depicted in FIG. 6B; that is, to obtain a mathematical function or "formula" representative of the shape of each of the waveforms. Then, corresponding significant elements of the mathematical functions representative of the target and reference waveforms are compared to determine which reference image most closely matches the target image. For example, if the target and reference waveforms are represented by the function $y=F(x, a, b)$, the reference waveform whose values of x, a and b most closely match the x, a and b values of the target waveform is the reference waveform that most closely matches the target waveform (where a and/or b can be a constant or exponent of x).

In a still further embodiment of the present invention, the step of comparing the target waveform to the golden waveform (step 440) and the step of matching the target waveform to one of the reference waveforms (step 450) comprise using the target and reference waveforms to generate images of the target feature and the reference features, and then comparing the generated images. In other words, waveforms as illustrated in FIG. 6B are manipulated using conventional computer graphics techniques to generate images as shown in FIG. 6A. The generated images are then matched, as by well-known pattern recognition techniques such as boundary analysis and grey-scale analysis.

In further embodiments of the present invention, an apparatus for processing a semiconductor wafer is provided wherein a wafer is removed from a wafer cassette, and a dimension of a feature on the surface of the wafer is measured, such as feature CD using an optical measuring tool. A process, such as an etch process, is then performed on the wafer using a set of process parameter values, such as an etch recipe, selected based on the CD measurement, and the wafer is returned to a cassette. In some embodiments, post-etch processing, such as ash stripping, wet cleaning and/or further CD measurement, are performed by the apparatus before the wafer is returned to a cassette. All of the transfer and processing steps performed by the apparatus are performed in a clean environment, thereby increasing yield by avoiding exposing the wafer to the atmosphere and possible contamination between steps.

Furthermore, these embodiments of the present invention provide for pre-etch CD measurement of every wafer and adjustment of the etch recipe for every wafer according to its CD measurement to correct for process variations in previously visited tools, such as exposure and focus variations at a photo cell. This is in contrast to prior art methodologies, which typically measure CD of sample wafers before and/or after etch processing and use this information for processing the next batch of wafers. The present invention increases yield by performing real time measurement of every wafer and adjusting the etch recipe for every wafer.

An apparatus for processing a semiconductor wafer according to the present invention will now be described with reference to FIG. 9A. The apparatus comprises a chamber or "mainframe" 901, such as the Centura™ processing system, available from Applied Materials of Santa Clara, Calif., for mounting a plurality of processing chambers, such as conventional etch processors 902, and one or more transfer chambers 903, also called "load locks". Mainframe 901 is capable of maintaining a vacuum environment in its interior. A robot 904 is provided for transferring wafers between processing chambers 902 and transfer chambers 903.

Transfer chambers 903 are connected to a factory interface 905, also known as a "mini environment", which maintains a controlled environment. A CD measurement tool 906, such as an optical measurement tool utilizing scatterometry or reflectometry techniques, is mounted inside factory interface 905. An example of a tool that can be used as measurement tool 906 is imager 310 described above (see FIGS. 3 and 4A), which can include the CD measurement tool described in U.S. Pat. No. 5,963,329. A processor (i.e., a processor corresponding to processor 320) to provide etcher 902 an etch recipe based on the wafer CD measurement can be part of etcher 902 or mainframe 901. One or more robots 907, or a track robot, are also mounted inside factory interface 905 for transferring wafers between transfer chambers 903, measurement tool 906 and standard wafer cassettes 908 removably attached to factory interface 905. Mainframe 901, transfer chambers 903, factory interface 905 and robots 904, 907 are all parts of a conventional processing system such as the above-referenced Applied Materials Centura™, and communicate with each other while maintaining a clean, controlled environment. Such conventional processing systems further comprise a processor, such as a computer (not shown) to electronically control the operation of the system, including the transfer of wafers from one part of the system to another.

The operation of the apparatus according to this embodiment of the present invention will now be described with reference to the flow chart of FIG. 10. After a plurality of wafers are processed at a processing tool, such as photo cell 360 described above, they are loaded into a cassette 908, and the cassette is transferred to factory interface 905 at step 1010. A wafer is then unloaded from cassette 908 and transferred to measurement tool 906 by robot 907 (step 1020) and the CD of a feature or features formed on the surface of the wafer are measured at step 1030. In certain embodiments of the present invention, the wafer is also optically aligned at measurement tool 906; that is, the notch of the wafer is oriented to a predetermined position. For example, measurement tool 906 can align the wafer, perform its CD measurement, then re-align the wafer if necessary (since it may have been moved during inspection) to ensure that the wafer notch is in the proper position for subsequent handling by robot 907.

At step 1040, an etch recipe for the wafer is selected based on the wafer's CD measurement. For example, a "signature analysis" can be carried out for the wafer's CD measurement data according to the embodiment of the present invention of FIGS. 3 and 4A–4B, described above, wherein data from the CD measurement is compared to reference data from a library to search for variations, which are then parameterized (i.e., converted into etch process parameters). Alternatively, a root coupled wave analysis (RCWA) can be performed, wherein a CD corresponding to a given waveform is derived by calculation, such as by a processor in an optical inspection tool. RCWA is discussed in Chateau, "Algorithm for the rigorous couple-wave analysis of grating diffraction", *Journal of the Optical Society of America,* Vol. 11, No. 4 (April 1994) and Moharam, "Stable implementation of the rigorous coupled-wave analysis for surface-relief gratings: enhanced transmittance matrix approach", *Journal of the Optical Society of America,* Vol. 12, No. 3 (May 1995). As also described in the embodiment of FIGS. 3, 4A and 4B, the results of this analysis can also be fed back to photo cell 360 to select revised stepper settings.

At step 1050, the wafer is transferred from measurement tool 906 to etcher 902 using robot 907 to move the wafer to transfer chamber 903, and using robot 904 to move the wafer to etcher 902. The wafer is then etched (step 1060). This etch step can be a resist trim step, a feature formation step (e.g., a polysilicon gate etch), or both. Next, in one embodiment of the present invention, the wafer is returned to cassette 908 via robots 904, 907 and transfer chamber 903 (step 1090).

Alternatively, the wafer can first be transferred back to measurement tool 906 for a post-etch CD measurement (steps 1070 and 1080) before being loaded into cassette 908. Data acquired by measurement tool 906 can be compared to post-etch data from previously processed wafers. If a significant variation from the normal post-etch data is observed, the wafer can then be returned to cassette 908, then cleaned and reviewed at a review tool, such as a CD-SEM. Thus, measurement tool 906 is used as a process monitor to indicate when review is necessary.

Figure 9A:
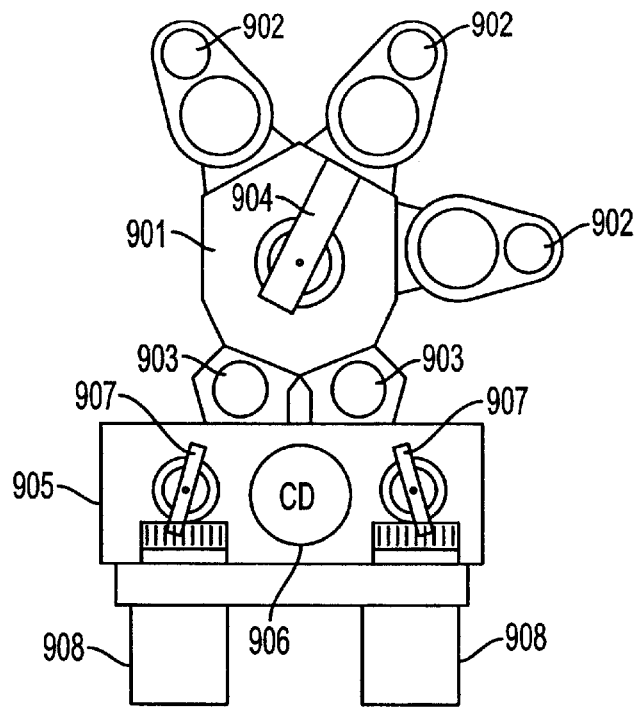
FIGS. 9A–9C schematically illustrate processing modules according to embodiments of the present invention.
Figure 9B:
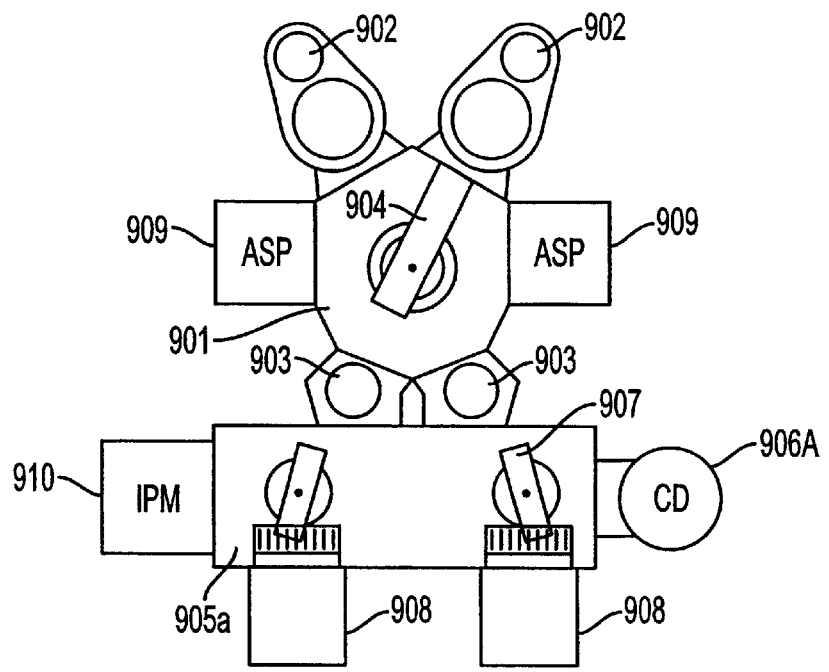

In a further embodiment of the present invention illustrated in FIG. 9B, conventional ashing strip processors 909 (called "ASPs") are mounted on mainframe 901 along with etchers 902. ASPs 909 are for removing photoresist polymers and other residue from wafers after etching. Factory interface 905a has a CD measurement tool 906a mounted to it (instead of inside it as in the embodiment of FIG. 9A) as well as an integrated particle monitor 910 (called an "IPM"), such as the Excite™ available from Applied Materials of Santa Clara, Calif. IPM 910 is for detecting foreign particles and other defects on the surface of wafers.

Figure 10:
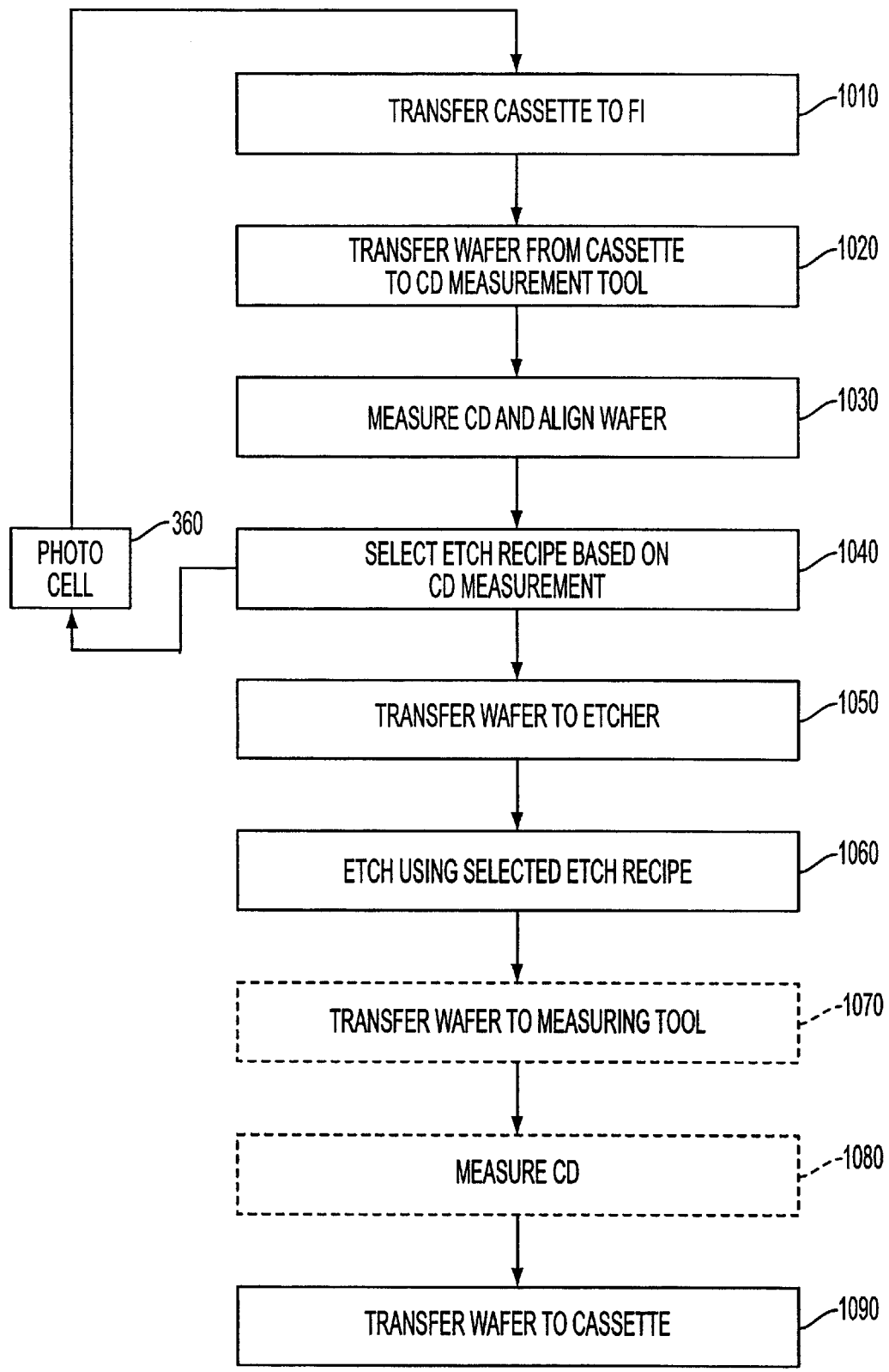
FIG. 10 is a flow chart illustrating sequential steps in methods according to embodiments of the present invention.

The apparatus of FIG. 9B operates according to the flow chart of FIG. 10 as described above, except that after the wafer is etched at step 1060, it is cleaned in ASP 909 before being transferred to measurement tool 906a at step 1070 for post-etch CD measurement (step 1080). The wafer then visits IPM 910 before being returned to cassette 908 at step 1090.

Figure 9C:
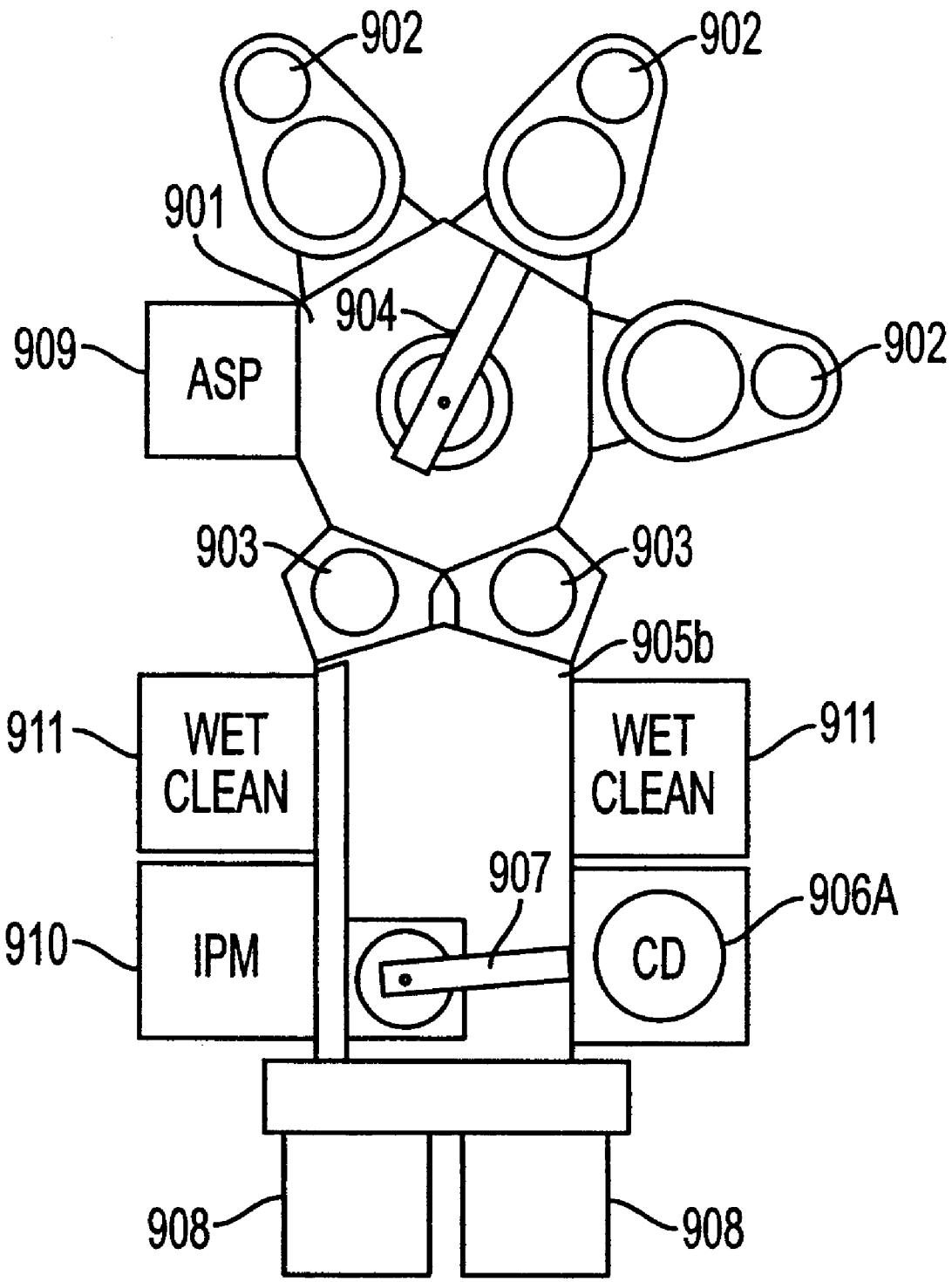

In a still further embodiment of the present invention illustrated in FIG. 9C, wet clean modules 911, as described, e.g., in U.S. patent application Ser. No. 09/603,792, are mounted on factory interface 905a along with measurement tool 906a and IPM 910. The apparatus of FIG. 9C operates according to the flow chart of FIG. 10 as described above, except that after the wafer is etched at step 1060, it is cleaned in ASP 909 and wet clean module 911 before being transferred to measurement tool 906a at step 1070 for post-etch CD measurement (step 1080). The wafer then visits IPM 910 before being returned to cassette 908 at step 1090.

The embodiments of the present invention illustrated in FIGS. 9A–C provide pre-etch CD measurement, etching, cleaning, and post-etch CD measurement entirely under controlled environmental conditions. By providing etching, cleaning and measurement tools on the mainframe and/or factory interface, the wafer can be etched, cleaned and inspected before being returned to a cassette, thereby reducing processing time and cost. Moreover, the embodiments of FIGS. 9A–C provide feedback and feed forward of CD measurement data in real time for every wafer, thereby enabling etch processing to be customized for every wafer to increase yield. Thus, the present invention provides increases in yield and decreases in production costs vis-à-vis prior art systems, wherein feedback from CD measurements, if any, is on a lot-to-lot basis rather than for every wafer, and wafers must be exposed to the atmosphere between measuring, etching and cleaning steps.

Further exemplary embodiments of the present invention, which can be implemented using the apparatus of FIGS. 9A–9C, will now be described with reference to the flow charts of FIGS. 7 and 8. In these embodiments of the present invention, CD at the resist trim and feature etch processes (such as gate etch, shallow trench isolation (STI) trench etch, via etch, contact hole etch, metal etch, etc.) is tightly controlled using feedback and feed forward of CD measurement in real time under controlled environmental conditions.

Figure 7:
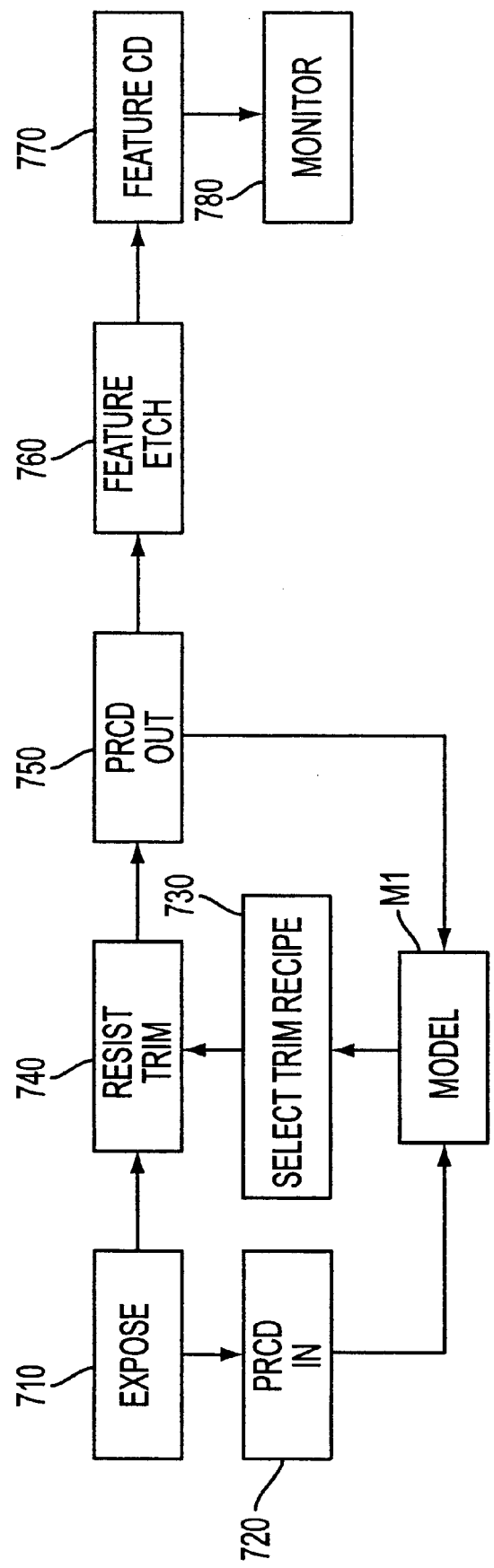
FIG. 7 is a block diagram of a measurement tool according to an embodiment of the present invention.
Figure 8:
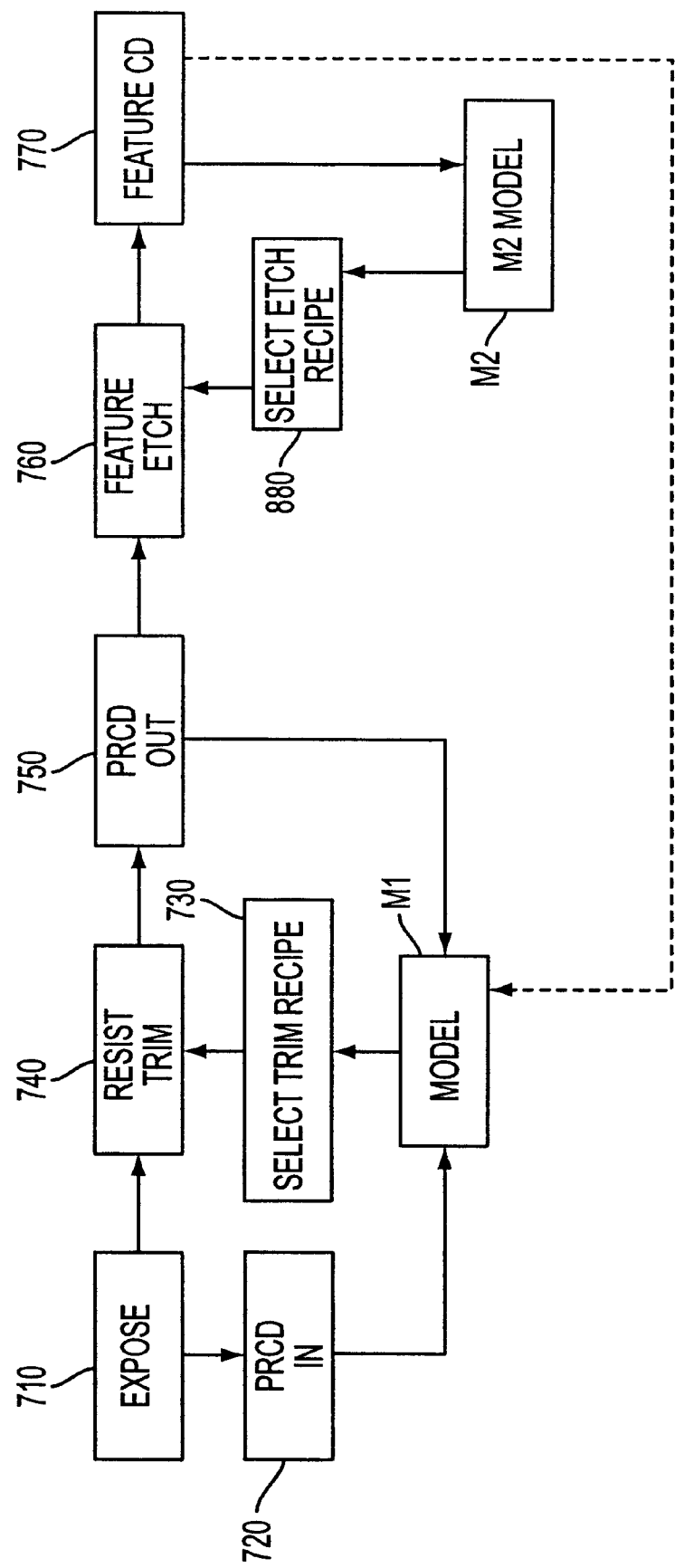
FIG. 8 is a flow chart illustrating sequential steps in a method according to an embodiment of the present invention.

Referring now to FIGS. 7 and 9A, a plurality of wafers are processed in a conventional manner at a processing tool, such as photo cell 360 described above, to expose and develop a photoresist layer to form patterns in the photoresist. As in previously described embodiments, the wafers are loaded into cassette 908, the cassette is transferred to factory interface 905, a wafer is then unloaded from cassette 908 and transferred to measurement tool 906 by robot 907, the wafer is aligned, and the CD of the photoresist patterns ("PRCD In") is measured at step 720.

At step 730, a trim recipe for the photoresist is selected based on the photoresist patterns' CD measurement. For example, a signature analysis or RCWA as described above can be carried out for the patterns' CD measurement data, and the results of this analysis fed forward to update a process model M1 used to adjust the trim recipe for the wafer.

The wafer is transferred from measurement tool 906 to etcher 902 using robot 907 to move the wafer to transfer chamber 903, and using robot 904 to move the wafer to etcher 902. The photoresist patterns are then etched (step 740) to trim or shrink the photoresist patterns to a target size. The resist trim is typically an isotropic etch step. Next, the wafer is transferred back to measurement tool 906 for a post-trim CD measurement ("PRCD Out") at step 750. PRCD Out is fed back to update process model M1 to adjust the trim recipe for subsequently processed wafers.

The wafer is then transferred by robot 904 to the same or another etch chamber 902, and the layer underlying the photoresist is etched at step 760, using the trimmed photoresist patterns as a mask, to form features such as transistor gates, trenches, vias, etc. of the desired size. In one embodiment of the present invention, the wafer is transferred back to measurement tool 906 for a post-etch CD measurement ("Feature CD") at step 770 before being returned to cassette 908. Data acquired by measurement tool 906 can be compared to post-etch data from previously processed wafers at step 780. If a significant variation from the normal post-etch data is observed, the wafer can then be returned to cassette 908, then cleaned and reviewed at a review tool, such as a CD-SEM. Thus, measurement tool 906 is used as a process monitor to indicate when review is necessary.

In a further embodiment of the present invention illustrated in FIG. 8, a process identical to that described above with reference to FIG. 7 is carried out, except that after the etched features° CD is measured at step 770, the data is fed back to update a process model M2 to select an etch recipe for subsequently processed wafers at step 880. In a still further embodiment of the present invention, feature CD data acquired at step 770 is also fed back to update process model M1 to adjust the trim recipe for subsequently processed wafers at step 730.

Although the embodiments of FIGS. 7 and 8 have been described with reference to the apparatus of FIG. 9A for convenience, it should be understood that these embodiments can be implemented at the apparatus of FIGS. 9B and 9C. Of course, the cleaning and/or further inspection steps described above available at the apparatus of FIGS. 9B and 9C can be performed as appropriate and/or desired.

Figure 5:
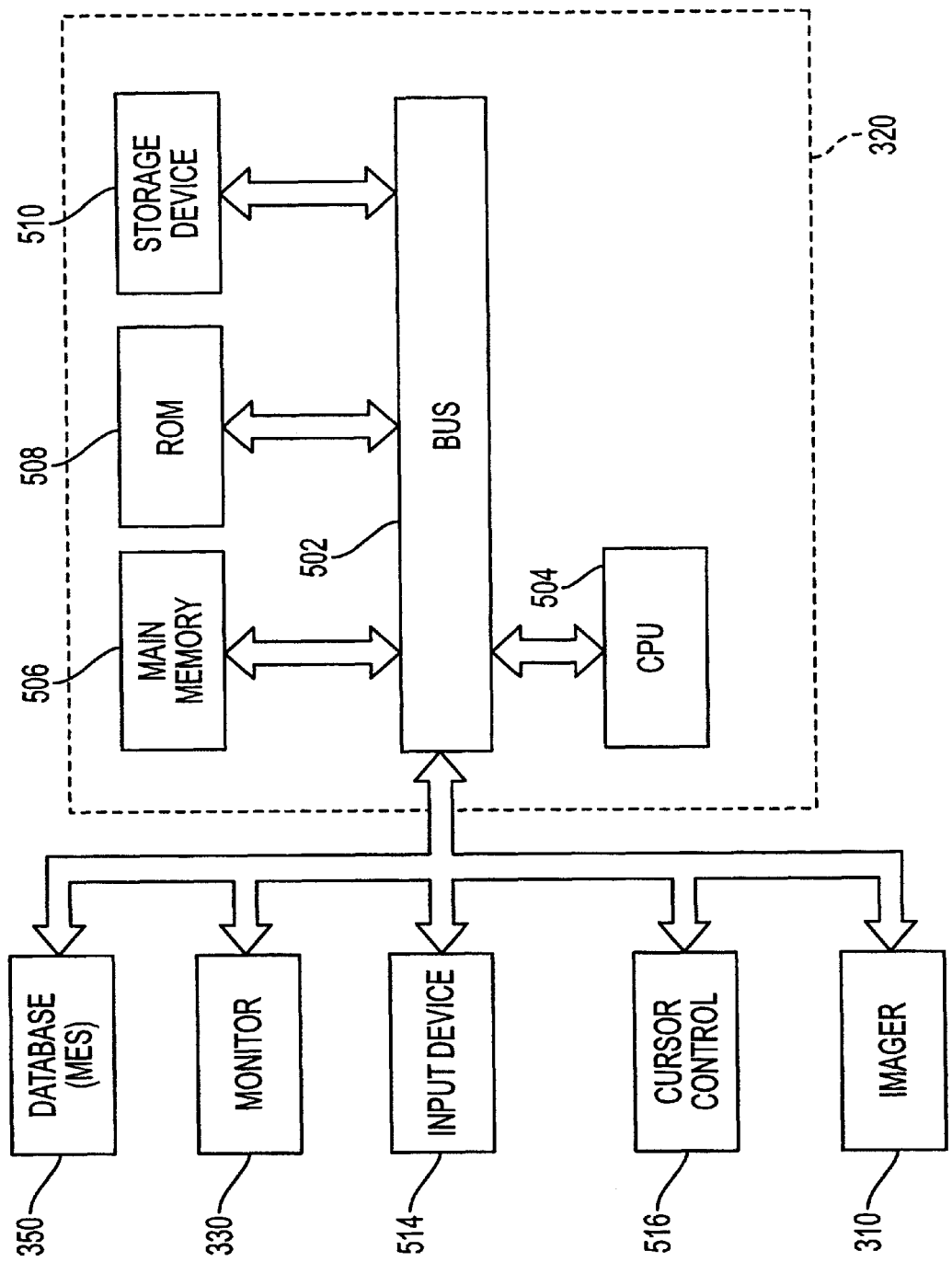
FIG. 5 is a block diagram that illustrates an embodiment of the invention.

FIG. 5 is a block diagram that illustrates an embodiment of the invention. According to this embodiment, processor 320, as shown in FIG. 5, includes a bus 502 or other communication mechanism for communicating information, and a central processing unit 504 coupled with bus 502 for processing information. Processor 320 also includes a main memory 506, such as a random access memory (RAM) or other dynamic storage device, coupled to bus 502 for storing information and instructions to be executed by CPU 504. Main memory 506 also may be used for storing temporary variables or other intermediate information during execution of instructions to be executed by CPU 504. Processor 320 further includes a read only memory (ROM) 508 or other static storage device coupled to bus 502 for storing static information and instructions for CPU 504. A storage device 510, such as a magnetic disk or optical disk, is provided and coupled to bus 502 for storing information and instructions. Storage device 510 may also serve as memory 340 in FIG. 3.

Processor 320 may be coupled via bus 502 to monitor 330, such as a cathode ray tube (CRT), for displaying information to a computer user. An input device 514, including alphanumeric and other keys, is coupled to bus 502 for communicating information and command selections to CPU 504. Another type of user input device is cursor control 516, such as a mouse, a trackball, or cursor direction keys for communicating direction information and command selections to CPU 504 and for controlling cursor movement on monitor 330.

Imager 310 (FIG. 3) inputs data representative of features of a semiconductor wafer under inspection, as discussed above, to bus 502. Such data may be stored in main memory 506 and/or storage device 510, and used by CPU 504 as it executes instructions. Imager 310 may also receive instructions via bus 502 from CPU 504.

The invention is related to the use of processor 320 for inspecting features formed on the surface of a semiconductor wafer and controlling processing of the wafer. According to one embodiment of the invention, inspection of the surface of the wafer and wafer process control is provided by processor 320 in response to CPU 504 executing one or more sequences of one or more instructions contained in main memory 506. Such instructions may be read into main memory 506 from another computer-readable medium, such as storage device 510. Execution of the sequences of instructions contained in main memory 506 causes CPU 504 to perform the process steps described above. One or more processors in a multi-processing arrangement may also be employed to execute the sequences of instructions contained in main memory 506. In alternative embodiments, hardwired circuitry may be used in place of or in combination with software instructions to implement the invention. Thus, embodiments of the invention are not limited to any specific combination of hardware circuitry and software. The programming of the apparatus is readily accomplished by one of ordinary skill in the art provided with the flow chart of FIG. 4.

The term "computer-readable medium" as used herein refers to any medium that participates in providing instructions to CPU 504 for execution. Such a medium may take many forms, including but not limited to, non-volatile media, volatile media, and transmission media. Non-volatile media include, for example, optical or magnetic disks, such as storage device 510. Volatile media include dynamic memory, such as main memory 506. Transmission media include coaxial cable, copper wire and fiber optics, including the wires that comprise bus 502. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, or any other medium from which a computer can read.

Various forms of computer-readable media may be involved in carrying out one or more sequences of one or more instructions to CPU 504 for execution. For example, the instructions may initially be borne on a magnetic disk of a remote computer. The remote computer can load the instructions into its dynamic memory and send the instructions over a telephone line using a modem. A modem local to processor 320 can receive the data on the telephone line and use an infrared transmitter to convert the data to an infrared signal. An infrared detector coupled to bus 502 can receive the data carried in the infrared signal and place the data on bus 502. Bus 502 carries the data to main memory 506, from which CPU 504 retrieves and executes the instructions. The instructions received by main memory 506 may optionally be stored on storage device 510 either before or after execution by CPU 504.

The inventive process control technique enables lot to lot CD variations to be reduced without significantly reducing production throughput by using data gathered during the inspection process to adjust photolithography and etch process parameters. The inventive methodology determines an inspected feature's stepper settings and optimal etch recipe by comparing its SEM waveform with the waveforms of a library of reference features obtained by forming a pre-production FEM. Therefore, the present invention is especially useful during the start-up and ramp-up of a production line.

The present invention is applicable to the manufacture of various types of semiconductor devices, particularly high density semiconductor devices having a design rule of about 0.18$\mu$ and under.

The present invention can be practiced by employing conventional materials, methodology and equipment. Accordingly, the details of such materials, equipment and methodology are not set forth herein in detail. In the previous descriptions, numerous specific details are set forth, such as specific materials, structures, chemicals, processes, etc., in order to provide a thorough understanding of the present invention. However, it should be recognized that the present invention can be practiced without resorting to the details specifically set forth. In other instances, well known processing structures have not been described in detail, in order not to unnecessarily obscure the present invention.

Only the preferred embodiment of the present invention and but a few examples of its versatility are shown and described in the present disclosure. It is to be understood that the present invention is capable of use in various other combinations and environments and is capable of changes or modifications within the scope of the inventive concept as expressed herein.

What is claimed is:

1. An apparatus for processing a semiconductor wafer, comprising:
   a measuring tool for measuring a dimension of a structure on the wafer;
   a first processing tool for performing a first process on the wafer using a first set of process parameter values;
   a transfer mechanism for transferring the wafer between the measuring tool and the first processing tool;
   a chamber for enclosing the transfer mechanism and allowing communication between the transfer mechanism, the measuring tool and the first processing tool in a clean environment; and
   a processor configured to select the first set of process parameter values based on the measurement of the dimension;
   wherein the measuring tool is for measuring a critical dimension (CD) of a target feature on the wafer;
   wherein the chamber comprises:
      a mainframe for mounting a plurality of processing tools, including the first processing tool;
      a factory interface for housing the measurement tool and for mounting a wafer cassette; and
      a transfer chamber between and in communication with the mainframe and the factory interface; and
   wherein the transfer mechanism comprises a first robot for transferring the wafer between the measurement tool, the transfer chamber and the wafer cassette, and a second robot for transferring the wafer between the transfer chamber and the first processing tool.

2. The apparatus of claim 1, wherein the processor is further configured to:
   select a second set of process parameter values based on the measurement of the wafer dimension, and
   provide the second set of process parameter values to a previously visited processing tool.

3. The apparatus of claim 1, wherein measuring tool optically measures the CD of the target feature.

4. The apparatus of claim 3, wherein the target feature CD is measured using scatterometry or reflectometry.

5. The apparatus of claim 1, wherein the first processing tool comprises an etcher, and the first process parameter values comprise an etch recipe.

6. The apparatus of claim 1, wherein the measuring tool is further for aligning the wafer.

7. An apparatus for processing a semiconductor wafer, comprising:
   a measuring tool for measuring a dimension of a structure on the wafer;
   a first processing tool for performing a first process on the wafer using a first set of process parameter values;
   a transfer mechanism for transferring the wafer between the measuring tool and the first processing tool;
   a chamber for enclosing the transfer mechanism and allowing communication between the transfer mechanism, the measuring tool and the first processing tool in a clean environment; and a processor configured to:
- select the first set of process parameter values based on the measurement of the dimension;
- control the transfer mechanism to transfer the wafer from the first processing tool to the measuring tool after the first process is performed on the wafer; and
- control the measuring tool to re-measure the dimension of the wafer.

8. An apparatus for processing a semiconductor wafer, comprising:

a measuring tool for measuring a dimension of a structure on the wafer;

a first processing tool for performing a first process on the wafer using a first set of process parameter values, the first processing tool comprising an etcher and the first set of process parameter values comprising an etch recipe;

a transfer mechanism for transferring the wafer between the measuring tool and the first processing tool;

a chamber for enclosing the transfer mechanism and allowing communication between the transfer mechanism, the measuring tool and the first processing tool in a clean environment;

a processor configured to select the first set of process parameter values based on the measurement of the dimension;

wherein the measuring tool is for measuring a critical dimension (CD) of a target feature on the wafer;

wherein the chamber comprises a mainframe to which the etcher is mounted, a factory interface to which the measurement tool and a wafer cassette are mounted, and a transfer chamber between the mainframe and the factory interface; and wherein the transfer mechanism comprises a robot for transferring the wafer between the measurement tool, the transfer chamber and the wafer cassette;

the apparatus further comprising a cleaning module mounted to the factory interface for cleaning the wafer;

wherein the processor is configured to control the transfer mechanism to transfer the wafer from the cassette to the measuring tool, to transfer the wafer from the measuring tool to the first processing tool after the CD of the target feature is measured, to transfer the wafer from the first processing tool to the cleaning module after the first process is performed on the wafer; and to transfer the wafer from the cleaning module to the cassette after the wafer has been cleaned.

9. An apparatus for processing a semiconductor wafer, comprising:

a measuring tool for measuring a dimension of a structure on the wafer;

a first processing tool for performing a first process on the wafer using a first set of process parameter values;

a transfer mechanism for transferring the wafer between the measuring tool and the first processing tool;

a chamber for enclosing the transfer mechanism and allowing communication between the transfer mechanism, the measuring tool and the first processing tool in a clean environment; and a processor configured to select the first set of process parameter values based on the measurement of the dimension;

wherein the chamber comprises a mainframe for mounting a plurality of processing tools;

wherein the first processing tool is mounted to the mainframe;

wherein the transfer mechanism comprises a robot; and wherein the measuring tool is mounted to the mainframe.

10. The apparatus of claim 1, further comprising a particle monitor mounted to the factory interface and in communication with the transfer mechanism.

* * * * *